United States Patent [19]
Imaizumi et al.

[11] Patent Number: 5,895,989
[45] Date of Patent: Apr. 20, 1999

[54] POWER SUPPLY UNIT AND CONNECTOR CONNECTION FAILURE DETECTION METHOD

[75] Inventors: Nobuhiro Imaizumi; Hiromichi Hanaoka; Tatsuaki Oniishi, all of Shizuoka, Japan

[73] Assignee: Yazaki Corporation, Tokyo, Japan

[21] Appl. No.: 08/956,432

[22] Filed: Oct. 23, 1997

[30] Foreign Application Priority Data

Oct. 23, 1996 [JP] Japan ................ 8-280766

[51] Int. Cl.$^6$ ........................................ H02H 3/027
[52] U.S. Cl. ................ 307/139; 307/125; 361/88; 340/644
[58] Field of Search ........................ 307/139, 125, 307/130; 327/1; 361/88; 324/415; 340/644

[56] References Cited

U.S. PATENT DOCUMENTS

| 4,023,073 | 5/1977 | Georgi | 327/1 |
| 4,088,988 | 5/1978 | Berger | 340/500 |
| 4,688,223 | 8/1987 | Motika et al. | 371/21.4 |
| 5,304,935 | 4/1994 | Rathke et al. | 340/644 |
| 5,327,016 | 7/1994 | Su et al. | 327/1 |

*Primary Examiner*—Albert W. Paladini
*Attorney, Agent, or Firm*—Sughrue, Mion, Zinn, Macpeak & Seas, PLLC

[57] ABSTRACT

A power supply unit adapted to supply power from a power supply section to a load via a plurality of power supply lines connected by an on/off switch and connectors. The power supply unit includes a load open detection section for detecting an open state between the on/off switch and the load, a monitor section for monitoring the number of times the open state has been entered per unit time based on the detection result of the load open detection section, and a control section for controlling the on/off switch off when the number of times the open state has been entered per unit time is greater than a predetermined number of times.

7 Claims, 4 Drawing Sheets

POWER SUPPLY UNIT AND CONNECTOR CONNECTION FAILURE DETECTION METHOD

BACKGROUND OF THE INVENTION

1. Field of the Invention

This invention relates to a power supply unit and a connector connection failure detection method, and is applicable to a vehicle power supply unit for supplying power from a battery or an alternator via a wire harness to loads of head lights, etc., for example.

2. Description of the Related Art

Conventional power supply to loads of a vehicle is executed according to a configuration as shown in FIG. 5. The configuration in FIG. 5 will be discussed. Power from a power supply section 1 of a battery, an alternator, or the like is supplied to an output driver 2 made of a semiconductor switch, etc. The output driver 2 is controlled based on a control signal S1 from a CPU (central processing unit) 3. When the control signal S1 is positive logic, the output driver 2 outputs power supplied from the power supply section 1 to a power supply line 4.

Here, the CPU 3 receives time division data such as ignition switch information and vehicle state information from another control unit installed in the vehicle over multiple signal lines 5 and generates the control signal S1 based on the data. The CPU 3 and the output driver 2 are installed on a single circuit board 6 placed in a junction box.

A circuit board connector 7 formed in the circuit board 6 is joined to a harness connector 9 formed at one end of a harness 8, whereby the power supply line 4 is electrically connected to a load 10 via the connectors 7 and 9 and the harness 8 and thus power is supplied to the load 10.

In this connection, in fact, a plurality of output drivers 2 corresponding to a plurality of loads are disposed in the circuit board 6. Therefore, a plurality of power supply lines 4 from the output drivers 2 are introduced into the circuit board connector 7. Likewise, the harness 8 formed with the harness connector 9 comprises a bundle of power supply lines connected to a plurality of loads 10.

If connection of the circuit board connector 7 and the harness connector 9 is incomplete, there is a fear of occurrence of an arc based on a connection failure between a terminal 7A of the circuit board connector 7 and a terminal 9A of the harness connector 9. Reliability of power supply lowers and if various conditions overlap, it is also feared that an arc may cause a vehicle fire in the worst case.

In this connection, such a connector connection failure is caused by a connector insertion mistake of a worker or vibration when the vehicle runs.

SUMMARY OF THE INVENTION

It is therefore an object of the invention to provide a power supply unit and a connector connection failure detection method capable of avoiding degradation of power supply reliability based on a connector connection failure.

In order to achieve the above object, the invention provides a power supply unit adapted to supply power from a power supply section to a load via a plurality of power supply lines connected by an on/off switch and connectors. The power supply unit includes a load open detector for detecting an open state between the on/off switch and the load; a monitor for monitoring the number of times the open state has been entered per unit time based on a detection result of the load open detector; and a controller means for controlling the on/off switch off when the number of times the open state has been entered per unit time is greater than a predetermined number of times.

Further, the invention provides a method for detecting a connection failure of connectors when power from a power supply section is supplied to a load via a plurality of power supply lines connected by an on/off switch and the connectors. The method includes the steps of: detecting the number of times an open state has been entered between the on/off switch and the load per unit time; and determining that a connection failure has occurred in the connectors when the number of times the open state has been entered is greater than a predetermined number of times.

DETAILED DESCRIPTION OF THE PREFERRED EMBODIMENTS

First, the basic configuration of a power supply unit according to the present invention will be described with reference to FIG. 1.

Figure 1:
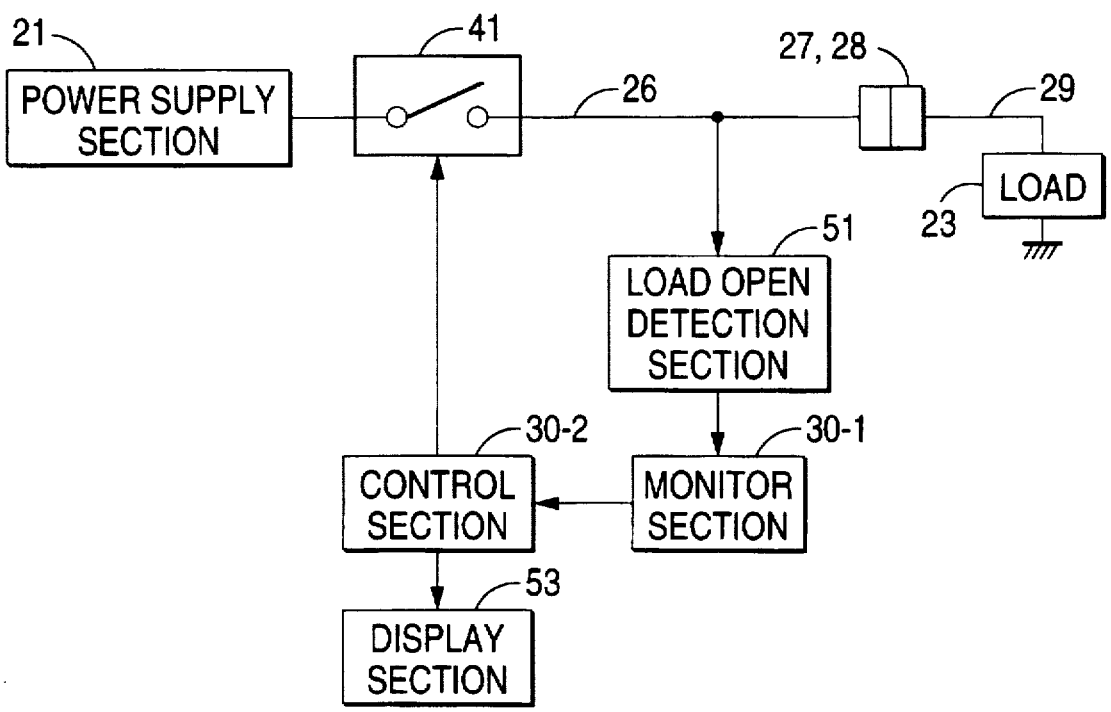
FIG. 1 is a block diagram to show the basic configuration of a power supply unit according to the invention.

In FIG. 1, the power supply unit is adapted to supply power from a power supply section 21 to a load 23 via a plurality of power supply lines 26 and 29 connected by an on/off switch 41 and connectors 27 and 28. Further, the power supply unit comprises a load open detection section 51 for detecting an open state between the on/off switch 41 and the load 23, a monitor section 30-1 for monitoring the number of times the open state has been entered per unit time based on the detection result of the load open detection section 51, and a control section 30-2 for controlling the on/off switch 41 off when the number of times the open state has been entered per unit time is greater than a predetermined number of times.

In the above configuration, if an open state and a closed state are repeated between the on/off switch 41 and the load 23, the number of open state times monitored by the monitor section 30-1 increases and the control section 30-2 controls the on/off switch 41 off. If the number of open state times is zero, it means that the connectors 27 and 28 are well connected. If the number of open state times is small, it means that the terminals of the connectors 27 and 28 repeat contact and noncontact at a comparatively far distance from each other, in which case an arc scarcely occurs between the terminals of the connectors 27 and 28, thus the on/off switch 41 is not controlled off. In contrast, if the number of times the open state has been entered per unit time is greater than a predetermined number of times, it means that the terminals of the connectors 27 and 28 repeat contact and noncontact at a comparatively near distance to each other, in which case an arc easily occurs between the terminals of the connectors 27 and 28, thus the on/off switch 41 is controlled off. Therefore, occurrence of an arc caused by a connection failure of the connectors 27 and 28 can be avoided and power supply reliability can be improved.

Further, the control section 30-2 causes a predetermined display section 53 to display a connection failure of the connectors 27 and 28 when the number of times the open state has been entered per unit time is greater than a predetermined number of times.

In this configuration, the user can know that the connectors 27 and 28 are in a connection failure state from the warning display produced on the display section 53. For example, if the insertion state of the connectors 27 and 28 is incomplete, the user can place the connectors in a complete insertion state, thereby easily solving the abnormality.

Furthermore, the on/off switch 41 and the load open detection section 51 are provided in an intelligent power switch.

In this configuration, the existing load open detection section 51 provided in the intelligent power switch can be used to detect a connection failure of the connectors 27 and 28. Thus, new parts need not be added and power supply reliability can be improved without increasing the number of parts.

In a connector connection failure detection method according to the invention, when power from a power supply section is supplied to a load via a plurality of power supply lines connected by an on/off switch and connectors, the number of times an open state has been entered between the on/off switch and the load per unit time is detected, and it is determined that a connection failure occurs in the connectors when the number of times the open state has been entered is greater than a predetermined number of times.

Thus, such a connector connection failure causing an arc to occur between the terminals of the connectors can be detected easily.

Hereinafter, preferred embodiments of the invention will be described.

Figure 2:
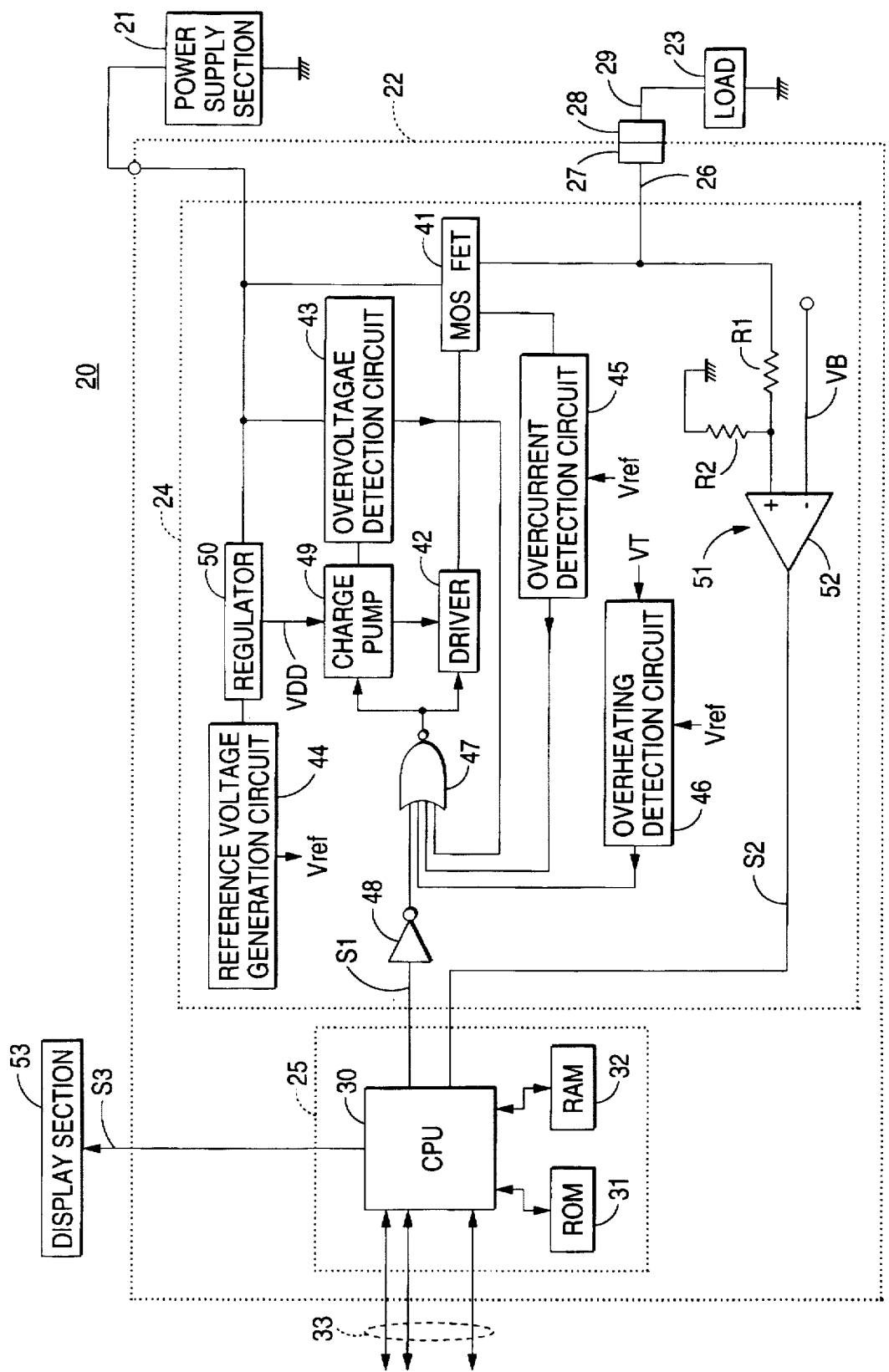
FIG. 2 is a block diagram to show the configuration of a vehicle power supply unit in an embodiment of the invention.

In FIG. 2, reference numeral 20 designates an entire vehicle power supply unit. The power supply unit 20 inputs power from a power supply section 21 of a battery, an alternator, or the like to a circuit board 22 placed in a junction box (not shown).

Mounted on the circuit board 22 are an intelligent power switch 24 having an on/off switch function for selectively supplying power from the power supply section 21 to a load 23 by the on/off operation and a microcomputer 25 for controlling the on/off operation of the intelligent power switch 24.

A circuit board connector 27 formed in the circuit board 22 is connected to a harness connector 28 formed at one end of a harness 29, whereby an output power supply line 26 of the intelligent power switch 24 is electrically connected to the load 23 via the connectors 27 and 28 and the harness 29 and thus power is supplied to the load 23.

A CPU 30 in the microcomputer 25 receives time division data such as ignition switch information and vehicle state information from another junction box and a control unit installed in the vehicle over multiple signal lines 33 and generates a control signal S1 for controlling the on/off operation of the intelligent power switch 24 based on the data.

The intelligent power switch 24 has a protection function of protecting a power MOS FET 41 as a main switching element placed on the power supply line from overcurrent or overheating. If a current exceeding a rated current flows into the power MOS FET 41 or the power MOS FET 41 rises to a temperature more than a specified temperature, the power MOS FET 41 is forcibly turned off, thereby protecting the power MOS FET 41.

The intelligent power switch 24 applies power supply voltage VB to a drain of the power MOS FET 41 and controls the on/off operation of the power MOS FET 41 by a driver 42.

The intelligent power switch 24 comprises an overvoltage detection circuit 43 for detecting overvoltage of the power supply voltage VB, an overcurrent detection circuit 45 for detecting overcurrent by comparing a voltage value based on a current value flowing between the drain and source of the power MOS FET 41 with reference voltage Vref from a reference voltage generation circuit 44, and an overheating detection circuit 46 for detecting overheating of the power MOS FET 41 by comparing temperature voltage value VT provided by a temperature sensor (not shown) disposed in the proximity of the power MOS FET 41 with the reference voltage Vref. The detection results of the detection circuits 43, 45, and 46 are input to a NOR circuit 47. The control signal S1 is also input to the NOR circuit 47 via an inverter 48.

Output of the NOR circuit 47 is fed into the driver 42 and a charge pump 49. The charge pump 49 operates only when the output of the NOR circuit 47 is positive logic; it raises power supply voltage VDD stabilized by a regulator 50 and supplies the power supply voltage VDD to the driver 42. If the output of the NOR circuit 47 is positive logic, the driver 42 gives such a control voltage turning on the power MOS FET 41 to a gate of the power MOS FET 41; if the output of the NOR circuit 47 is negative logic, the driver 42 gives such a control voltage turning off the power MOS FET 41 to the gate of the power MOS FET 41.

In the state in which the control signal S1 is positive logic (namely, a logical value specifying the on-operation), if an overvoltage is applied to the power MOS FET 41, if an overcurrent flows into the power MOS FET 41, or if the power MOS FET 41 is overheated, the intelligent power switch 24 can control the power MOS FET 41 off for protecting the power MOS FET 41 from overvoltage, overcurrent, or overheating.

In addition to the above configuration, the intelligent power switch 24 has a load open detection circuit 51. In the load open detection circuit 51, the power supply voltage VB is input to an inversion input terminal of a comparator 52 and the output power supply line 26 is connected to a non-inversion input terminal. Voltage of the output power supply line 26 is divided by resistors R1 and R2 and input to the non-inversion input terminal.

In the load open detection circuit 51, if a load open state is entered because the harness 29 is broken or the connectors 27 and 28 are disconnected, the voltage at the non-inversion input terminal rises to the power supply voltage VB, thus a positive-logic state signal S2 is output from the comparator 52.

That is, when the load is not open in a state in which the power MOS FET 41 is controlled on, a voltage lower than the power supply voltage VB by the voltage drop caused by the power MOS FET 41 and the voltage division resistors R1 and R2 is input to the non-inversion input terminal of the comparator 52. Thus, at this time, a negative-logic state signal S2 is output from the comparator 52. In contrast, when the load is open, a voltage equal to the power supply voltage VB is input to the non-inversion input terminal of the comparator 52. Thus, at this time, a positive-logic state signal S2 is output from the comparator 52.

The state signal S2 is fed into the CPU 30. The CPU 30 detects the load being open and the connectors 27 and 28 being in a connection failure based on the state signal S2. If the CPU 30 detects a connection failure, it switches the control signal S1 from positive logic to negative logic, thereby controlling the intelligent power switch 24 off, whereby the power supply unit 20 can not only detect a load open state, but also avoid arc occurrence caused by a connection failure of the connectors 27 and 28 for improving reliability of power supply.

Figure 3:
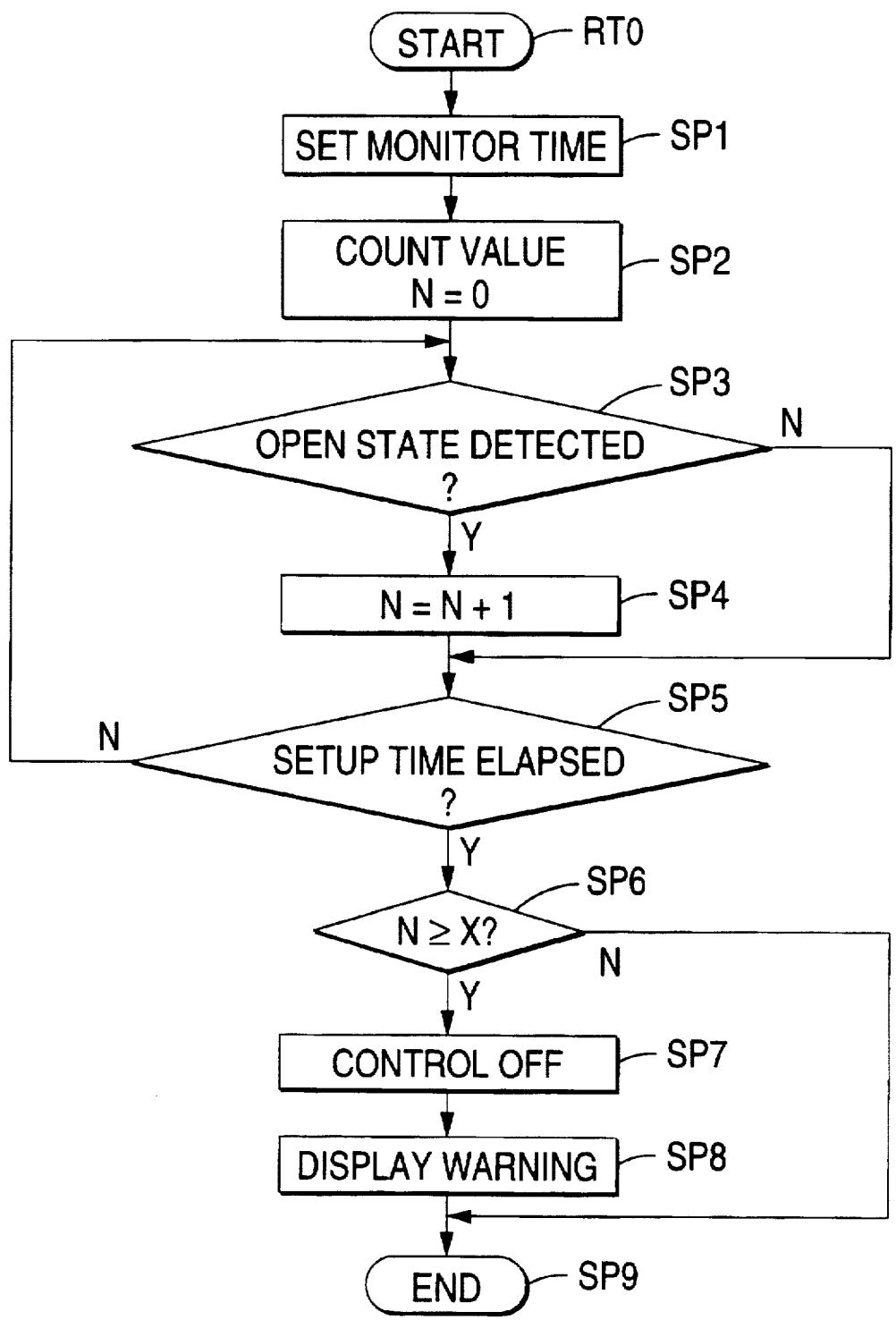
FIG. 3 is a flowchart to show a connector connection monitor process procedure.

Actually, the CPU 30 executes a connector connection monitor process procedure as shown in FIG. 3 in accordance with programs stored in a ROM (read-only memory) 31 and a RAM (random access memory) 32, thereby avoiding arc occurrence caused by a connection failure of the connectors 27 and 28. That is, when the CPU 30 starts the connector connection monitor process procedure at RT0, it first sets the monitor time at step SP1 and resets the count value of an internal counter to zero at step SP2.

Next, at step SP3, the CPU 30 determines whether or not a load open state is detected based on the logical value output from the comparator 52. If a load open state is detected, namely, positive logic is output from the comparator 52, the CPU 30 goes to step SP4 and increments the count value of the internal counter. In contrast, if no load open state is detected at step SP3, the CPU 30 goes to step SP5. In this connection, at step SP3, the CPU 30 determines whether or not a load open state is detected within each of time intervals into which the setup time is divided.

At step SP5, the CPU 30 determines whether or not the setup time has elapsed. If the setup time has not elapsed, the CPU 30 returns to step SP3. It thus repeats a loop of steps SP3-(SP4)-SP5-SP3 until a lapse of the setup time. If the setup time has elapsed and YES is returned at step SP5, the CPU 30 goes to step SP6.

At step SP6, the CPU 30 determines whether or not the count value of the internal counter is equal to or greater than a value X previously stored in the ROM 31 or the RAM 32. If the count value is equal to or greater than the value X, it means that a contact failure occurs between the connectors 27 and 28. Thus, the CPU 30 goes to step SP7 and switches the control signal S1 from positive logic to negative logic, thereby controlling the intelligent power switch 24 off. Next, the CPU 30 goes to step SP8 and sends a display signal S3 to a display section 53 for causing the display section 53 to display a warning of alerting the user to occurrence of a contact failure between the connectors 27 and 28.

After executing step SP8 or when NO is returned at step SP6, the CPU 30 goes to step SP9 and terminates the connector connection monitor process procedure.

According to the above configuration, the number of times an open state has been entered within the unit time between the power MOS FET 41 and the load 23 is counted and if the number of times is equal to or greater than a predetermined number of times, it is determined that a connection failure occurs between the connectors 27 and 28, then the power MOS FET 41 is controlled off and the power is shut off before the connectors 27 and 28, whereby occurrence of an arc caused by a connection failure of the connectors 27 and 28 is avoided and a high-reliability power supply can be provided.

If the number of times a load open state has been entered within the unit time is equal to or greater than the predetermined number of times, a connection failure of the connectors 27 and 28 is displayed on the display section 53, whereby the user can know that the connectors 27 and 28 are in a connection failure from the warning display. For example, if the insertion state of the connectors 27 and 28 is incomplete, the user can place the connectors in a complete insertion state, thereby easily solving the abnormality.

Figure 4:
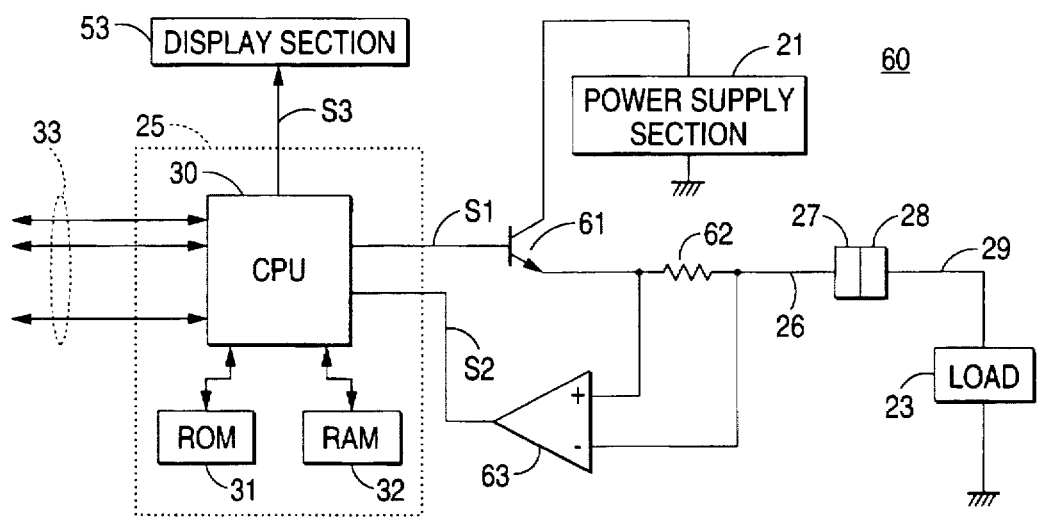
FIG. 4 is a block diagram to show the configuration of a power supply unit in another embodiment of the invention.
Figure 5:
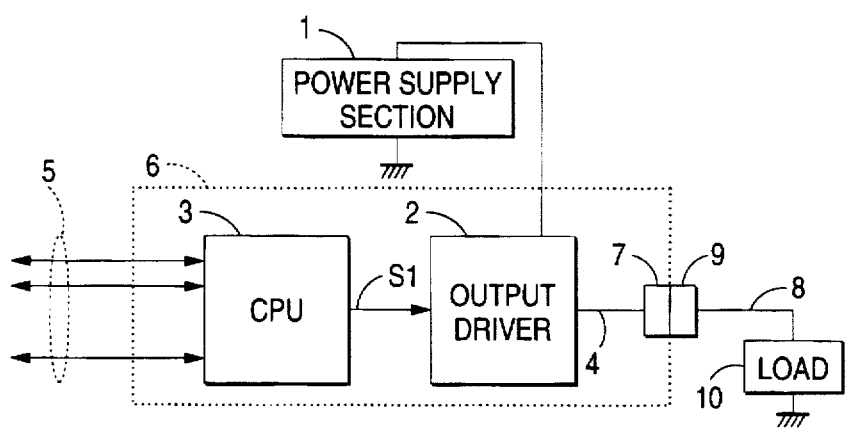
FIG. 5 is a connection diagram to show the configuration of a conventional power supply unit.
Figure 6:
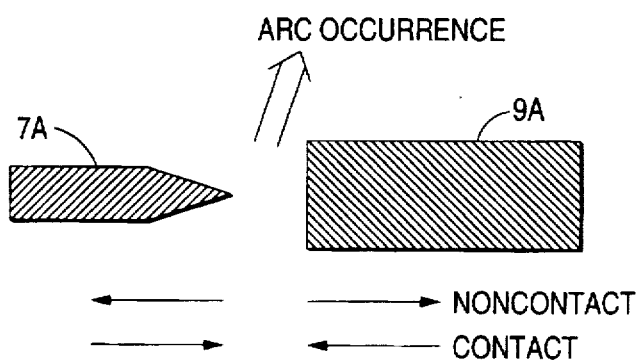
FIG. 6 is an illustration to explain occurrence of an arc caused by a connector connection failure.

In the above embodiment, the invention is embodied using the intelligent power switch 24, but not limited to it. For example, the configuration as shown in FIG. 4 may be adopted. Parts identical with or similar to those previously described with reference to FIG. 2 are designated by the same reference numerals in FIG. 4. In FIG. 4, in a power supply unit 60, a control signal S1 from a CPU 30 is input to a control input terminal of a semiconductor switch 61 as an on/off switch, a resistor 62 is disposed on an output power supply line 26 of the semiconductor switch 61, and voltages at both ends of the resistor 62 are input to a comparator 63. The resistor 62 and the comparator 63 make up load open detection means.

According to this configuration, when load is not open, a potential difference occurs in the voltages at both ends of the resistor 62, so that negative logic as a state signal S2 is output from the comparator 63; when load is open, a potential difference does not occur in the voltages at both ends of the resistor 62, so that positive logic as the state signal S2 is output from the comparator 63. Resultantly, if the state signal S2 is sent to the CPU 30, the operation and effects similar to those of the previously described embodiment can be realized.

In FIGS. 2 and 4, the semiconductor switch is used as the on/off switch, but the invention is not limited to it. For example, a relay having mechanical contacts may be used.

In the above embodiments, the power supply unit according to the invention is applied to the vehicle power supply unit, but the invention is not limited to it. The invention can be widely applied to power supply units adapted to supply power from a power supply section to a load via a plurality of power supply lines connected by an on/off switch and connectors.

According to the invention, the power supply unit comprises the load open detection section for detecting an open state between the on/off switch and the load, the monitor section for monitoring the number of times the open state has been entered per unit time based on the detection result of the load open detection section, and the control section for controlling the on/off switch off when the number of times the open state has been entered per unit time is greater than a predetermined number of times. Thus, a power supply unit that can avoid occurrence of an arc caused by a connection failure of the connectors and improve power supply reliability can be provided.

What is claimed is:

1. A power supply unit adapted to supply power from a power supply section to a load via a plurality of power supply lines connected by an on/off switch and connectors, said power supply unit comprising:

load open detection means for detecting an open state of said connectors between said on/off switch and said load;

monitor means for monitoring the number of times said open state has been entered per unit time based on a detection result of said load open detection means; and control means for controlling said on/off switch off when the number of times said open state has been entered per unit time is greater than a predetermined number of times.

2. The power supply unit as claimed in claim 1, further comprises display means connected to said control means;

wherein said control means controls said display means to display a connection failure of said connectors when the number of times said open state has been entered per unit time is greater than said predetermined number of times.

3. The power supply unit as claimed in claim 1, wherein said on/off switch and said load open detection means are provided in an intelligent power switch.

4. The power supply unit as claimed in claim 1, wherein said on/off switch comprises a transistor and said load open detection means comprises a comparator.

5. A method for detecting a connection failure of connectors when power from a power supply unit is supplied to a load via a plurality of power supply lines connected by an on/off switch and said connectors, said method comprising the steps of:

detecting the number of times an open state has been entered by said connectors between said on/off switch and said load per unit of time; and determining that a connection failure occurs in said connectors when the number of times the open state has been entered is greater than a predetermined number of times.

6. The method as claimed in claim 5, further comprising the step of controlling the on/off switch off after the determining step.

7. The method as claimed in claim 6, further comprising the step of displaying on a display section that the connection failure occurs in the connectors after the controlling step.

* * * * *